United States Patent
Kim

(10) Patent No.: US 7,586,330 B2
(45) Date of Patent: Sep. 8, 2009

(54) PRE-EMPHASIS APPARATUS, LOW VOLTAGE DIFFERENTIAL SIGNALING TRANSMITTER INCLUDING THE SAME AND PRE-EMPHASIS METHOD

(75) Inventor: Ju-Hyung Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 58 days.

(21) Appl. No.: 11/503,311

(22) Filed: Aug. 11, 2006

(65) Prior Publication Data

US 2007/0063739 A1    Mar. 22, 2007

(30) Foreign Application Priority Data

Aug. 12, 2005  (KR)  ...................... 10-2005-0074025

(51) Int. Cl.
  *H03K 19/0175*  (2006.01)
  *H03K 3/00*  (2006.01)
  *H03B 1/00*  (2006.01)
(52) U.S. Cl. ........................................ 326/82; 327/108
(58) Field of Classification Search ................... 326/68, 326/83, 86; 327/108, 109, 333
  See application file for complete search history.

(56) References Cited

U.S. PATENT DOCUMENTS 6,281,715 B1    8/2001  DeClue et al. ................. 327/65

| | | | |
|---|---|---|---|
| 7,196,557 B1* | 3/2007 | Kwasniewski et al. | 327/108 |
| 7,197,591 B2* | 3/2007 | Kwa et al. | 710/307 |
| 2005/0090215 A1* | 4/2005 | Cheng et al. | 455/180.3 |
| 2006/0076980 A1* | 4/2006 | Kim et al. | 326/87 |
| 2006/0158223 A1* | 7/2006 | Wang et al. | 326/86 |
| 2007/0115034 A1* | 5/2007 | Nguyen et al. | 327/112 |
| 2007/0263122 A1* | 11/2007 | Araki | 348/536 |

FOREIGN PATENT DOCUMENTS

JP  2002-368600  12/2002
JP  2004-088693  3/2004

* cited by examiner

*Primary Examiner*—Vibol Tan
*Assistant Examiner*—Dylan White
(74) *Attorney, Agent, or Firm*—Mills & Onello, LLP.

(57) ABSTRACT

A pre-emphasis apparatus of a LVDS transmitter includes a pre-emphasis signaling generation unit and a pre-emphasis current output unit. The pre-emphasis signal generation unit generates a pre-emphasis pulse signal based on N parallel data signals received from an external source and N-phase clock signals received from a phase locked loop, where N is an integer greater than 1. The pre-emphasis current output unit provides an additional current for a pre-emphasis operation to a current source of a LVDS driver in response to the pre-emphasis pulse signal generated by the pre-emphasis pulse signal generation unit. The pulse signal for pre-emphasis is generated based on the parallel data signals received from the external source and the multi-phase clock signals, which are output from the phase locked loop for performing a sampling of the parallel data signals.

23 Claims, 7 Drawing Sheets

PRE-EMPHASIS APPARATUS, LOW VOLTAGE DIFFERENTIAL SIGNALING TRANSMITTER INCLUDING THE SAME AND PRE-EMPHASIS METHOD

CROSS-REFERENCE TO RELATED APPLICATIONS

This application claims priority under 35 U.S.C. § 119 to Korean Patent Application No. 2005-74025 filed on Aug. 12, 2005, the contents of which are herein incorporated by reference in their entirety.

BACKGROUND OF THE INVENTION

1. Field of the Invention

The present invention relates to a pre-emphasis apparatus and a pre-emphasis method of a low voltage differential signaling (LVDS) transmitter, and more particularly to a pre-emphasis apparatus and a pre-emphasis method of a LVDS transmitter that can perform pre-emphasis using a parallel data signal and a multi-phase clock signal received from an external source.

2. Description of the Related Art

A low voltage differential signaling (LVDS) interface system is a circuit having the characteristics of high-speed operation, low current consumption and low electromagnetic interference (EMI), and generally used in various applications such as a semiconductor device, a liquid crystal display (LCD), a communication system and the like.

It is common for an LVDS interface system to include an LVDS transmitter that transmits a low voltage differential signal and a LVDS receiver that receives the transmitted low voltage differential signal.

FIG. 1 is a block diagram illustrating a configuration of a conventional LVDS transmitter, more particularly of a LVDS transmitter that transmits 8-bit color data of 8-bit in an LCD unit.

Referring to FIG. 1, the conventional LVDS transmitter is composed of a parallel/serial data conversion unit 20, a LVDS driver unit 40, and a phase locked loop (PLL) 30.

A data signal input to the LVDS transmitter is composed of an 8-bit red data signal, an 8-bit green data signal, an 8-bit blue data signal and a 4-bit control data signal. All the input data signals of 28-bit are input in parallel.

The parallel/serial data conversion unit 20 includes four parallel/serial data converters 21, 22, 23 and 24. The parallel/serial data converters 21, 22, 23 and 24 respectively convert input parallel data signals into serial data signals DA, DB, DC and DD in a none-return-to-zero (NRZ) data format.

Here, 7-bit parallel data signals are respectively input to the parallel/serial data converters 21, 22, 23 and 24. That is, since the four parallel data signals of 7-bits are respectively input to the four parallel/serial data converters 21, 22, 23 and 24, a total of 28-bit parallel data signals are input to the four parallel/serial data converters 21, 22, 23 and 24.

The serial data signals DA, DB, DC and DD output from the four parallel/serial data converters 21, 22, 23 and 24 in the parallel/serial data conversion unit 20 are respectively transmitted to four LVDS drivers 41, 42, 43 and 44 in a LVDS driver unit 40. Accordingly, one parallel input data element of 7-bits is serialized and input to each of the LVDS drivers 41, 42, 43 and 44.

The LVDS driver unit 40 converts the input serial data signals DA, DB, DC and DD into LVDS levels to output the converted LVDS level. As shown in FIG. 1, an additional LVDS driver 45 is included in the LVDS driver unit 40 to output a clock signal transmitted from the phase locked loop 30.

The phase locked loop 30 receives an input clock signal CLKIN and generates 7-phase clock signals for respectively sampling the input parallel data signals.

FIG. 2 is a circuit diagram illustrating transmission between a LVDS driver and a LVDS receiver. In FIG. 2, only the first LVDS driver 41 among the LVDS drivers 41, 42, 43 and 44 is illustrated for brevity.

Referring to FIG. 2, the LVDS driver 41 includes a constant current source AD that provides 3.5 mA of current and four transistor switches M1, M2, M3 and M4. The switches M1, M2, M3 and M4 is turned on/off in response to logic data signals input to the switches, namely, a serial data signal DA, and thus causing a current to flow through a transmission line. Therefore, the LVDS driver 41 generates a voltage difference of +/−350 mV level across a resistor Rx of 100 ohms-coupled to input terminals of a LVDS receiver 50. The LVDS receiver 50 amplifies the input voltage difference of +/−350 mV and converts the amplified voltage difference into a logic level, and thus determines whether the converted logic level corresponds to a logic high or a logic low level.

FIG. 3 is a timing diagram illustrating a process of converting a logic data signal input to the LVDS driver illustrated in FIG. 2 into a low voltage differential signal.

Referring to FIG. 2 and FIG. 3, when the serial data signal (DA) (i.e., the logic data) is input, a current of +3.5 mA/−3.5 mA flows in the transmission line depending on the high/low state. When the voltage across the resistor Rx coupled to the input terminals of the LVDS receiver 50 corresponds to a logic high level, the voltage of +350 mV is generated across the resistor Rx. When the voltage across the resistor Rx corresponds to a logic low level, the voltage of −350 mV is generated across the resistor Rx.

However, when the data signal is transmitted at a relatively slow rate, a voltage difference, generally of +/−350 mV level is generated at input terminals of a LVDS receiver. However, the voltage difference is decreased as the transmission speed of the data signals is increased.

For example, assuming that an input data signal is input at a speed of 135 MHz, the signaling driver should be operated at a data rate of 945 Mbps (=135×7) since the LVDS driver needs to process the 7 signals. However, since the constant current source AD continuously generates a current of 3.5 mA, the output signal is increasingly attenuated as the data rate is increased, and thus the amplitude is decreased.

In addition, the output signal is influenced by the length of the connected transmission line and by the load condition between the LVDS driver and the LVDS receiver.

Accordingly, the attenuation of the output signal deteriorates an Eye characteristic of the data signal and prevents normal data from being transmitted to the LVDS receiver.

As such, a pre-emphasis technique of generating a pre-emphasis pulse signal by detecting a transition section of the transmitted data signal and then compensating for amplitude of the data signal according to the pre-emphasis pulse signal has been employed.

FIG. 4 is a conceptual diagram illustrating a conventional pre-emphasis technique.

Referring to FIG. 4, the Eye characteristic is improved by compensating for a distortion using a pre-emphasis approach that compensates for (or reinforces) the amplitude during the transition section of the signal, when the low voltage differential signal is transmitted.

FIG. 5 is a schematic circuit diagram illustrating a configuration of a conventional pre-emphasis pulse signal generation circuit.

Referring to FIG. 5, the conventional pre-emphasis pulse signal generation circuit delays the input serial data signal (DA) using a delay unit 60 composed of a plurality of serially connected inverters 61 for a predetermined time. The delayed serial data signal (DA') and the serial data signal (DA) are provided to an exclusive-OR gate (XOR gate) 70, and a pre-emphasis pulse signal (PEM) for designating an amplitude reinforcement location is generated.

FIG. 6 is a timing diagram illustrating the primary signals for the pre-emphasis pulse signal generation circuit shown in FIG. 5.

Referring to FIG. 6, the pre-emphasis pulse signal (PEM) is generated for 1 unit interval (UI) during the transition sections, which require the pre-emphasis, of the serial data signal (DA), based on the results of an XOR operation on the input serial data signal (DA) and the delayed serial data signal (DA').

As described above, the conventional pre-emphasis depends on a delay time due to delay cells such as an inverter. However, such delay time is very sensitive to environmental factors such as process, voltage and temperature (PVT) (i.e., a process change), an operating power voltage change and an operating temperature change.

Accordingly, since the pre-emphasis pulse signal generated by the conventional pre-emphasis pulse signal generation circuit is readily varied by environmental factors and is not regularly maintained due to the characteristics of the delay circuit, it is difficult to perform accurate pre-emphasis, in particular with increasing data transmission rates.

SUMMARY OF THE INVENTION

Example embodiments of the present invention provide a pre-emphasis apparatus of a LVDS transmitter that can improve reliability by generating a pre-emphasis pulse signal using parallel input data received from an external source and a phase clock signal that is used to perform a sampling of the parallel data.

Example embodiments of the present invention also provide a LVDS transmitter having the above pre-emphasis apparatus.

Example embodiments of the present invention also provide a pre-emphasis method of a LVDS transmitter that can improve the reliability by generating a pre-emphasis signal that determines an amplitude reinforcement location using parallel data received from an external source and a phase clock signal that is used to perform a sampling of the parallel data.

In one aspect, a pre-emphasis apparatus of a low voltage differential signaling (LVDS) transmitter includes: a pre-emphasis signal generation unit configured to generate a pre-emphasis pulse signal based on N parallel data signals received from an external source and N-phase clock signals received from a phase locked loop, where n is an integer greater than 1; and a pre-emphasis current output unit configured to provide an additional current for a pre-emphasis operation to a current source of a LVDS driver in response to the pre-emphasis pulse signal generated by the pre-emphasis pulse signal generation unit.

The pre-emphasis pulse signal generation unit may include: N exclusive OR gates configured to perform an XOR operation on an input first parallel data signal and an input second parallel data signal adjacent to the input first parallel data signal to respectively output a first operational signal; N AND gates configured to perform an AND operation on the first operational signal and one of the N-phase clock signals corresponding to the input second parallel data signal to respectively output a second operational signal; and an OR gate configured to perform an OR operation on the second operational signal to output the pre-emphasis pulse signal. The N-phase clock signals may be used for sampling each of the parallel data signals when the N parallel data signals are converted into serial data signal.

The generated pre-emphasis pulse signal may be generated during a transition section of serial data signal when the N parallel data signals are converted into the serial data signals. The pre-emphasis pulse signal is generated for 1 unit interval (UI) during the transition section.

The pre-emphasis current output unit may include M additional current sources, which is connected in parallel to a current source of the LVDS transmitter and configured to provide additional currents in response to the pre-emphasis pulse signal, where M may be 3. Here, each of the additional current sources may provide about 25% of additional current to the current source of the LVDS driver.

The pre-emphasis apparatus of the LVDS transmitter may further include a pre-emphasis current select unit configured to control an additional current that is provided through the pre-emphasis current output unit.

The pre-emphasis current select unit may include a current source select unit configured to receive an additional current source select signal from an external source and configured to output an operation control signal, and select switches respectively connected in series to each of the additional current sources and each configured to be turned on in response to the operation control signal.

In another aspect, a low voltage differential signaling (LVDS) transmitter includes a phase locked loop configured to generate N-phase clock signals, where N is an integer greater than 1, a parallel/serial data converter configured to receive N parallel data signals from an external source and configured to convert the N parallel data signals into serial data signals in response to the N-phase clock signals, a LVDS driver configured to convert the serial data signals output from the parallel/serial data converter so that the serial data signals have a low voltage differential signal level, and a pre-emphasis unit configured to generate a pre-emphasis pulse signal in response to the N parallel data signals and the N-phase clock signals and configured to provide an additional current for a pre-emphasis operation to the LVDS driver.

The pre-emphasis unit may include a pre-emphasis pulse signal generation unit configured to generate the pre-emphasis pulse signal based on the N parallel data signals and the N-phase clock signals, and a pre-emphasis current output unit configured to provide the additional current to the LVDS driver in response to the pre-emphasis pulse signal generated by the pre-emphasis pulse signal generation unit.

The pre-emphasis pulse signal generation unit may include N exclusive OR gates configured to perform an XOR operation on an input first parallel data signal and an input second parallel data signal adjacent to the input first parallel data signal to respectively output a first operational signal, N AND gates configured to perform an AND operation on the first operational signal and the N-phase clock signals corresponding to the input second parallel data signal to respectively output second operational signals, and an OR gate configured to perform an OR operation on the second operational signals to output the pre-emphasis pulse signal.

In another aspect, a pre-emphasis method of a low voltage differential signaling (LVDS) transmitter includes generating a pre-emphasis pulse signal based on N parallel data signals received from an external source and N-phase clock signals received from a phase locked loop, where N is an integer greater than 1, and providing an additional current for a pre-emphasis operation to a current source of a LVDS driver in response to the generated pre-emphasis pulse signal.

Generating the pre-emphasis pulse signal can include outputting N first operational signals by respectively performing an XOR operation on a first parallel data signal of the parallel data signals and second parallel data signal of parallel data signals adjacent to the first parallel data signal, outputting N second operational signals by respectively performing an AND operation on one of the first operational signals and the N-phase clock signal corresponding to the second parallel data signal, and outputting the pre-emphasis pulse signal by performing an OR operation on the N second operational signals.

The pre-emphasis method of the LVDS transmitter can further include controlling an additional current to be provided in response to the pre-emphasis pulse signal. Here, adjusting an additional current may be controlled such that one of about 25%, 50% and 75% of additional current is provided to the current source of the LVDS driver.

BRIEF DESCRIPTION OF THE DRAWINGS

Example embodiments of the present invention will become more apparent by describing in detail example embodiments of the present invention with reference to the accompanying drawings, in which.

DESCRIPTION OF EMBODIMENTS OF THE INVENTION

Figure 1:
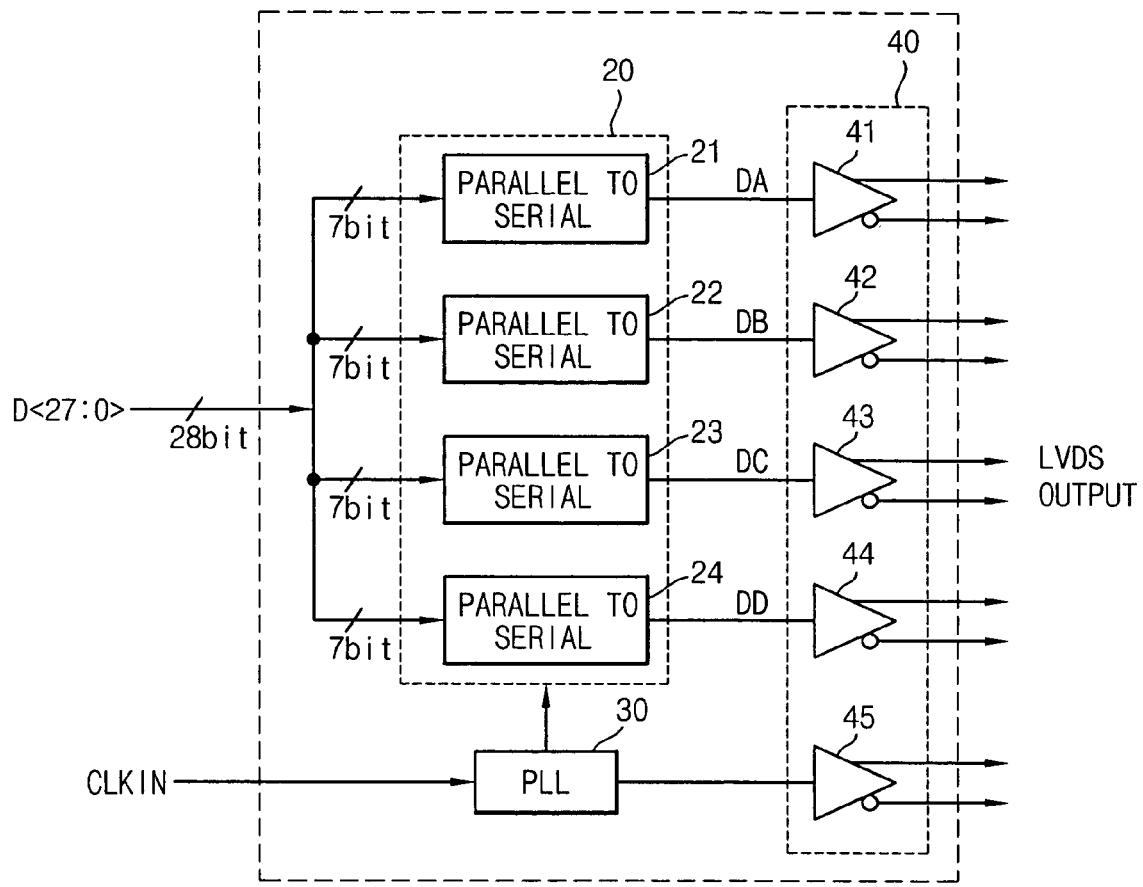
FIG. 1 is a block diagram illustrating a conventional LVDS transmitter.
Figure 2:
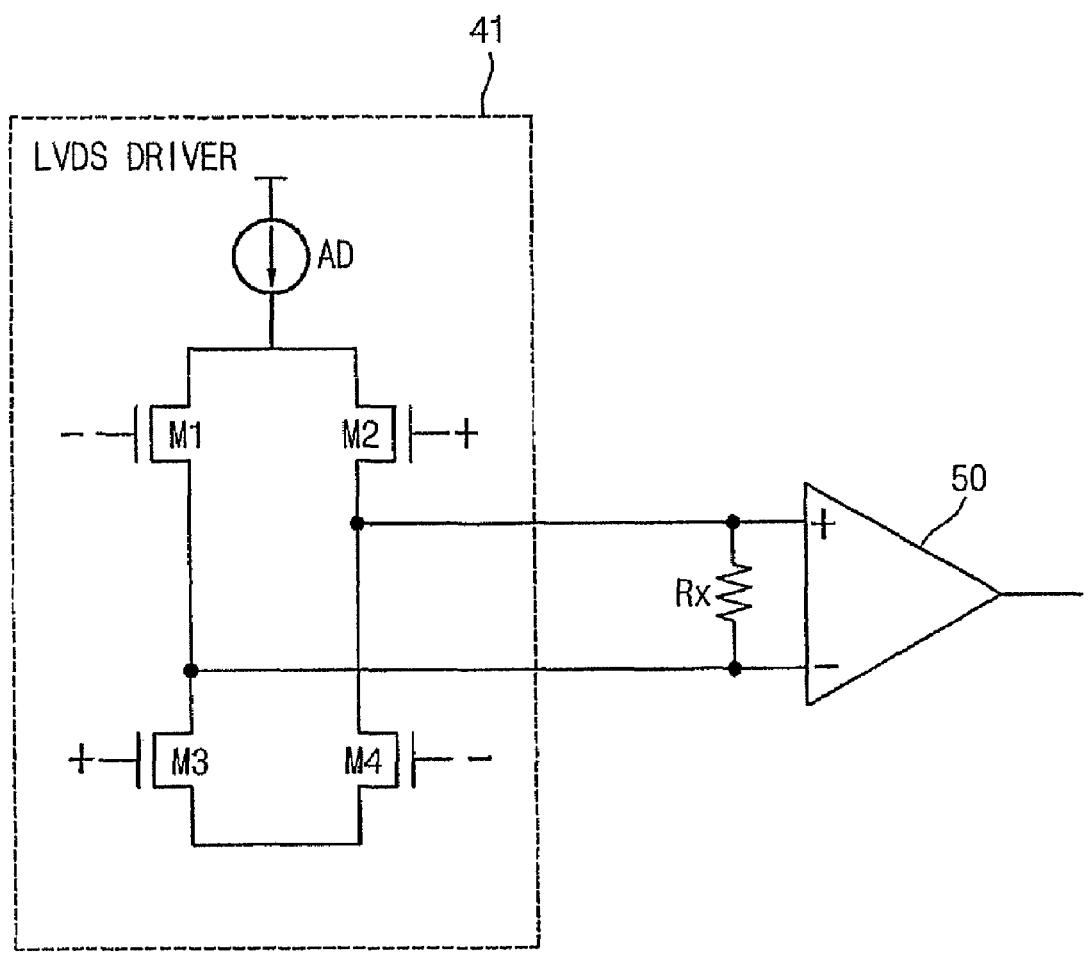
FIG. 2 is a circuit diagram illustrating transmission between a LVDS driver and a LVDS receiver.
Figure 3:
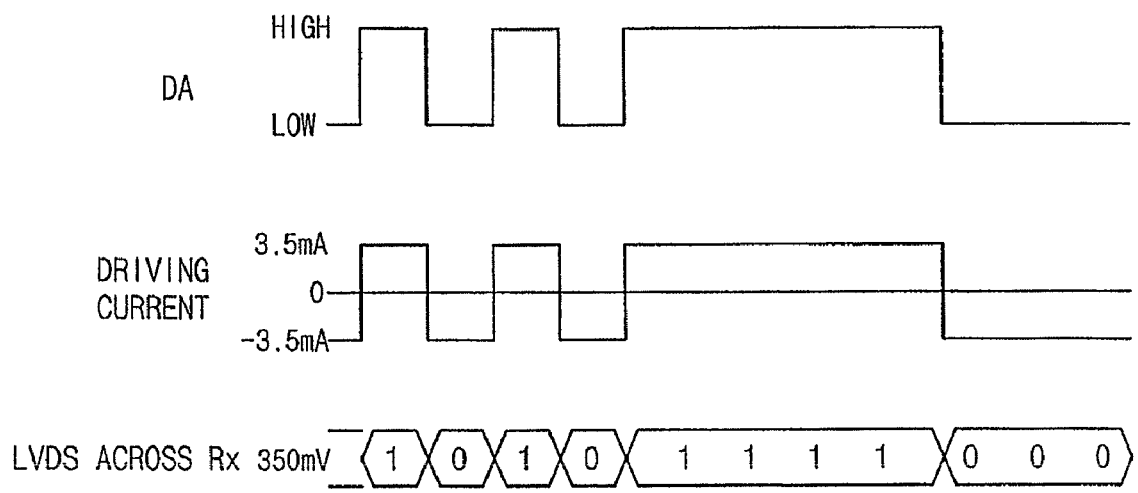
FIG. 3 is a timing diagram illustrating a process of converting a logic data signal input to the LVDS driver illustrated in FIG. 2 into a low voltage differential signal.
Figure 4:
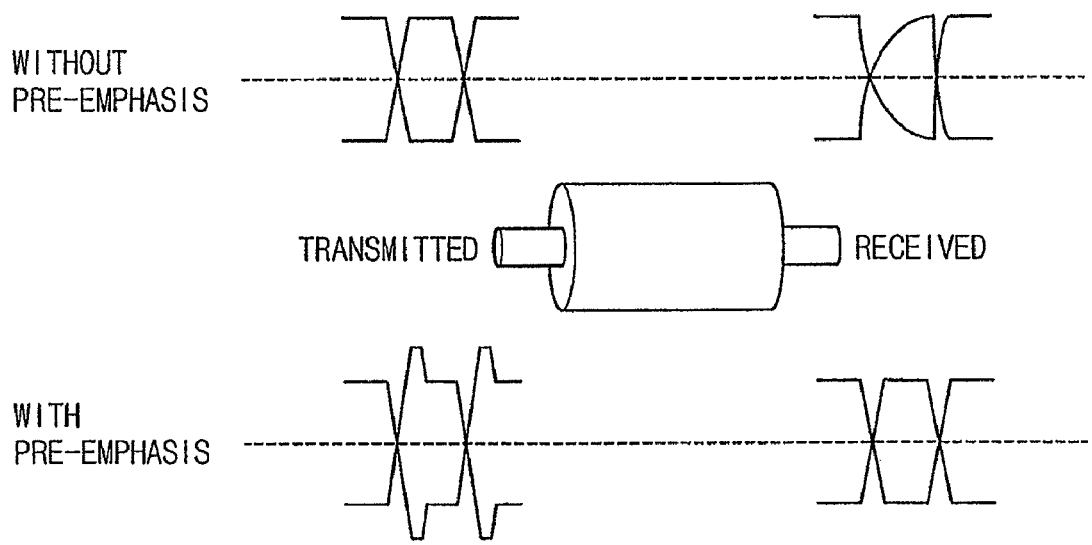
FIG. 4 is a conceptual diagram illustrating a concept of the pre-emphasis technique.
Figure 5:
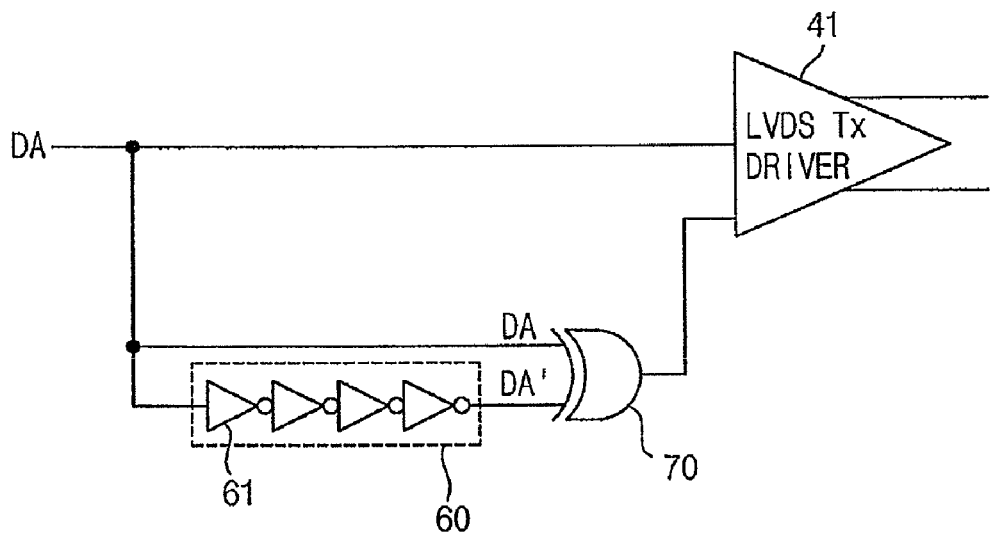
FIG. 5 is a schematic circuit diagram illustrating a configuration of a conventional pre-emphasis pulse signal generation circuit.
Figure 6:
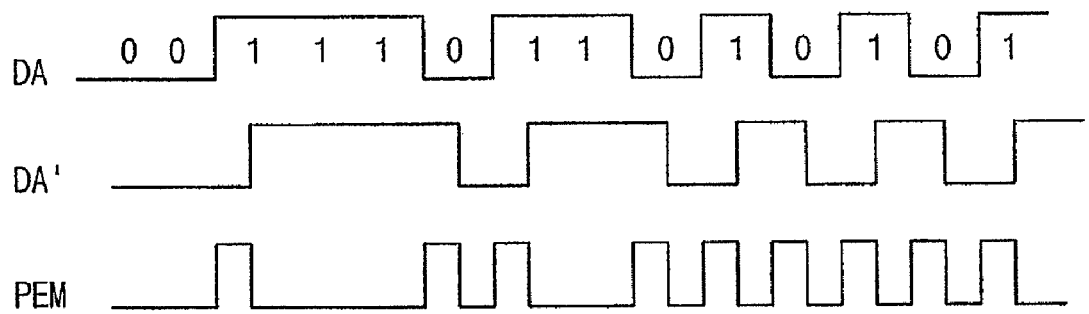
FIG. 6 is a timing diagram illustrating primary signals for the pre-emphasis pulse signal generation circuit shown in FIG. 5.

Example embodiments of the present invention are disclosed herein. However, specific structural and functional details disclosed herein are merely representative for purposes of describing example embodiments of the present invention. Example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/operations noted in the blocks may occur out of the order noted in the flowcharts. For example, two blocks shown in succession may in fact be executed substantially concurrently or the blocks may sometimes be executed in the reverse order, depending upon the functionality/operations involved.

Hereinafter, embodiments of the present invention will be described in detail with reference to the accompanying drawings. The embodiment will be explained in detail for enabling people who have common intellects in a corresponding field to execute the present invention.

Figure 7:
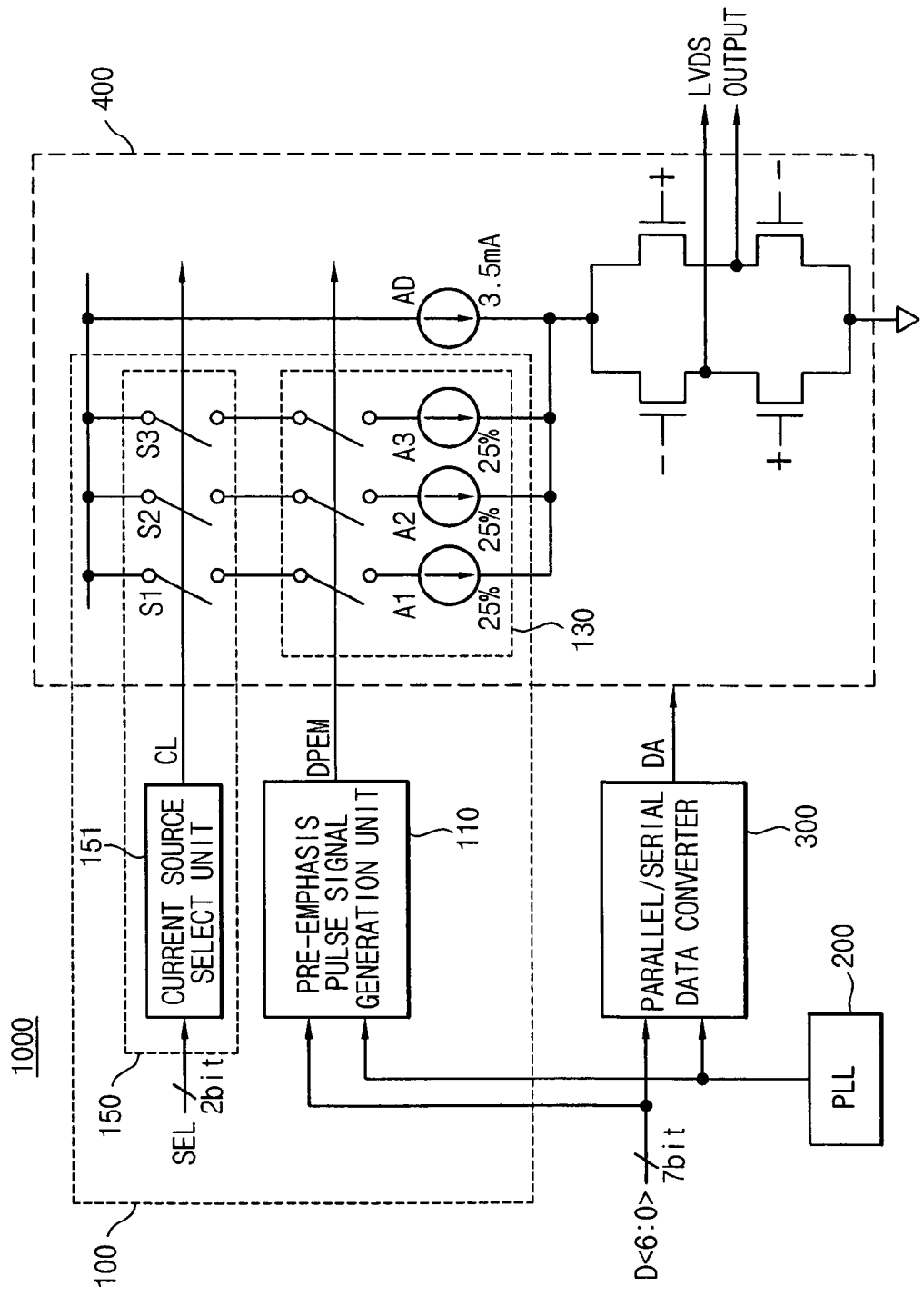
FIG. 7 is a block diagram illustrating a configuration of a LVDS transmitter having a pre-emphasis apparatus according to an example embodiment of the present invention.

FIG. 7 is a block diagram illustrating a configuration of a low voltage differential signaling (LVDS) transmitter having a pre-emphasis apparatus according to an example embodiment of the present invention. In FIG. 7, a configuration for transmitting a data signal corresponding to one channel is illustrated.

Referring to FIG. 7, seven parallel data signals D [6:0] corresponding to one channel are input to a low voltage differential signal transmitter 1000, as described with respect to FIG. 1.

The input 7 parallel data signals D [6:0] are converted into serial data signal (DA) by a parallel/serial data converter 300. Clock signals having seven phases output from a phase locked loop 200 are used to sample the respective parallel data signals D [6:0]. The serial data signal output from the parallel/serial data converter 300 is converted into a LVDS level by a LVDS driver 400 and output as a LVDS output signal.

A pre-emphasis apparatus 100, according to an example embodiment of the present invention, may include a pre-emphasis pulse signal generation unit 110, a pre-emphasis current select unit 150 and a pre-emphasis current output unit 130.

The pre-emphasis pulse signal generation unit 110 generates a pre-emphasis pulse signal (DPEM) using the 7 parallel data signals (D [6:0]) received from an external source and the 7-phase clock signals output from the phase locked loop 200, and transmits the generated pre-emphasis pulse signal (DPEM) to the pre-emphasis current output unit 130.

Figure 8:
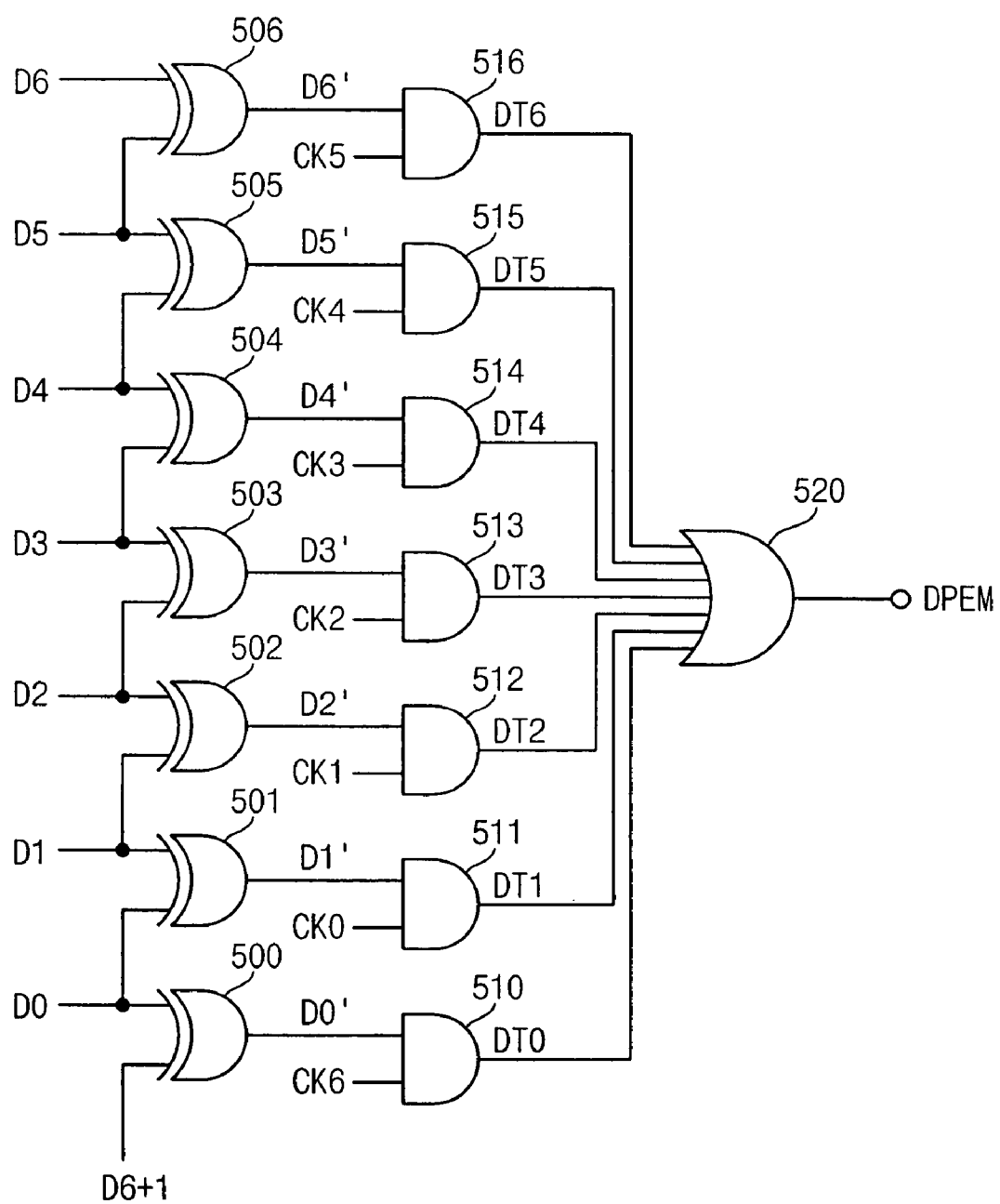
FIG. 8 is a logic circuit diagram illustrating the configuration of the pre-emphasis pulse signal generation unit shown in FIG. 7.

FIG. 8 is a logic circuit diagram illustrating the pre-emphasis pulse signal generation unit 110 shown in FIG. 7.

Referring to FIG. 8, 7 parallel data signals D6, D5, D4, D3, D2, D1 and D0, and 7-phase clock signals CK6, CK5, CK4, CK3, CK2, CK1 and CK0 are input to the pre-emphasis pulse signal generation unit 110.

The parallel data signals D6, D5, D4, D3, D2, D1 and D0, and the phase clock signals CK6, CK5, CK4, CK3, CK2, CK1 and CK0 are also input to the parallel/serial data converter 300 for the purpose of parallel/serial data conversion.

The phase clock signals CK6, CK5, CK4, CK3, CK2, CK1 and CK0 are clock signals for sequentially sampling the parallel data signals D6, D5, D4, D3, D2, D1 and D0 during the parallel/serial data conversion, and sequential pulses are generated in a sequence of CK6, CK5, CK4, CK3, CK2, CK1 and CK0. In the present invention, the pre-emphasis pulse signal DPEM is generated using these signals.

The pre-emphasis pulse signal generation unit 110 includes 7 exclusive OR gates (XOR Gates) 506, 505, 504, 503, 502, 501 and 500 that respectively perform an XOR operation on the parallel data signals D6, D5, D4, D3, D2, D1 and D0, and parallel data signals D5, D4, D3, D2, D1, D0 and D6 adjacent thereto, to respectively output first operational signals D6', D5', D4', D3', D2', D1' and D0', 7 AND gates that perform an AND operation (Logic AND) between the first operational signals D6', D5', D4', D3', D2', D1' and D0' respectively output from the exclusive OR gates 506, 505, 504, 503, 502, 501 and 500, and the 7 phase clock signals CK5, CK4, CK3, CK2, CK1, CK0 and CK6 corresponding to the adjacent parallel data signals D5, D4, D3, D2, D1, D0, D6, to respectively output second operational signals DT6, DT5, DT4, DT3, DT2, DT1 and DT0, and an OR gate 520 that performs an OR operation (Logic OR) on the second operational signals DT6, DT5, DT4, DT3, DT2, DT1 and DT0 output by the AND gates 516, 515, 514, 513, 512, 511 and 510 to output the pre-emphasis pulse signal (DPEM).

According to an example embodiment of the operation of the pre-emphasis pulse signal generation unit 110, the illustrated XOR gate 506 receives the input parallel data signal D6 and the parallel data signal D5 adjacent to the parallel data signal D6 and outputs the first operational signal D6'. This process is likewise performed by the 7 XOR gates 506, 505, 504, 503, 502, 501 and 500, and first operational signals D6', D5', D4', D3', D2', D1' and D0' are output.

The output first operational signal D6' is input to the corresponding AND gate 516. The illustrated AND gate 516 performs an AND operation on the input first operational signal D6' and the 7-phase clock signal CK5 corresponding to the adjacent parallel data signal D5 and outputs the second operational signal DT6. This process is likewise performed by the AND gates 516, 515, 514, 513, 512, 511 and 510, and the second operational signals DT6, DT5, DT4, DT3, DT2, DT1 and DT0 are output.

An OR operation of the output second output signals DT6, DT5, DT4, DT3, DT2, DT1 and DT0 is performed by the OR gate 520, and the pre-emphasis pulse signal (DPEM) is output as an output signal.

In order to perform the pre-emphasis operation, a point is detected at which the data signal transitions when the input parallel data signals are converted into serial data signals. Therefore, the pre-emphasis pulse signal is generated by performing an XOR operation capable of readily detecting a transition of a signal on adjacent signals and by processing the output signals of the XOR operation with 7-phase clock signals.

The pre-emphasis pulse signal (DPEM) output through the above-described process is expressed as a logic equation in Equation 1.

$$DPEM = DT6 \text{ OR } DT5 \text{ OR } DT4 \text{ OR } DT3 \text{ OR } DT2 \text{ OR } DT1 \text{ OR } DT0 \qquad [\text{Equation 1}]$$

wherein,
DT6=(D6 XOR D5) AND CK5
DT5=(D5 XOR D4) AND CK4
DT4=(D4 XOR D3) AND CK3
DT3=(D3 XOR D2) AND CK2
DT2=(D2 XOR D1) AND CK1
DT1=(D1 XOR D0) AND CK0
DT0=(D0 XOR D6+1 AND CK6 (D6+1 is a signal next to D6)

Figure 9:
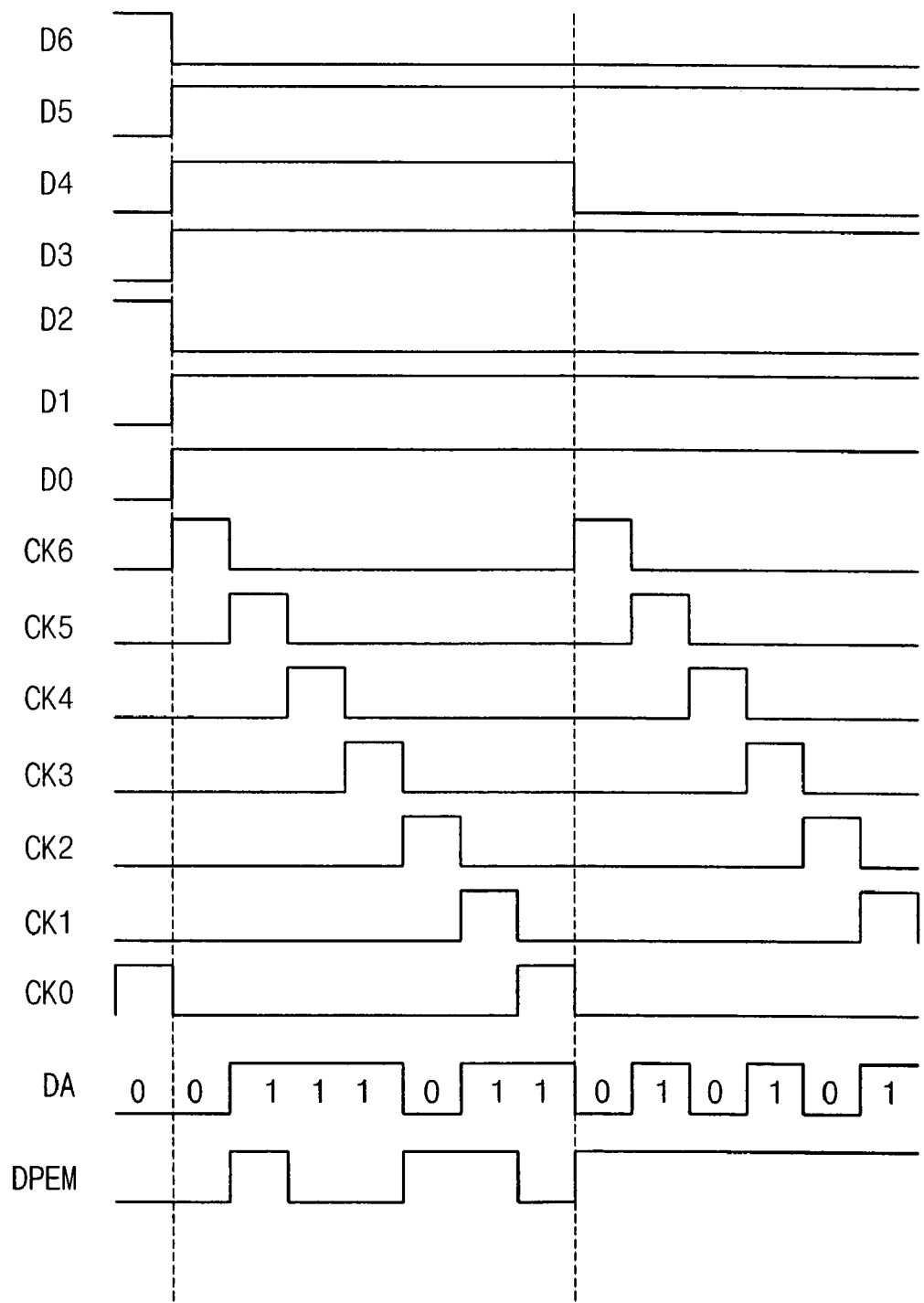
FIG. 9 is a timing diagram illustrating the state of primary signals according to the configuration of the pre-emphasis pulse signal generation unit shown in FIG. 8.

FIG. 9 is a timing diagram illustrating the primary signals of the pre-emphasis pulse signal generation unit 110 shown in FIG. 8.

Referring to FIG. 9, the serial data signal DA is generated by parallel/serial data conversion of the input parallel data signals D6, D5, D4, D3, D2, D1 and D0. Further, the 7-phase clock signals CK6, CK5, CK4, CK3, CK2, CK1 and CK0 generate sequentially a pulse signal of 1 unit interval (UI).

Here, considering the pre-emphasis pulse signal (DPEM) generated using the parallel data signals D6, D5, D4, D3, D2, D1 and D0, and the 7-phase clock signals CK6, CK5, CK4, CK3, CK2, CK1 and CK0, the pulse of 1 UI is generated whenever the serial data signal DA transitions from '0' to '1' or '1' to '0.'

Referring again to FIG. 7, additional current sources A1, A2 and A3 in the pre-emphasis current output unit 130 can be driven based on the generated pre-emphasis pulse signal (DPEM).

Referring to FIG. 7, the pre-emphasis current output unit 130 provides an additional current for pre-emphasis to the LVDS driver 400 in response to the output pre-emphasis pulse signal (DPEM).

The pre-emphasis current output unit 130 is connected in a parallel to a current source (AD) of the LVDS driver 400, and includes 3 additional current sources A1, A2 and A3 which are driven based on the pre-emphasis pulse signal (DPEM). Although the number of the additional current sources is illustrated as 3 in FIG. 7, it is apparent that current sources of various numbers may be provided.

The respective additional current sources A1, A2 and A3 additionally provide 25% of the current required for the pre-emphasis to the current source AD of the LVDS driver 400. Accordingly, when only one additional current source (e.g., A1) is used, 25% of the current is additionally provided. When two current sources (e.g., A1 and A2) are used, 50% of the current is additionally provided. Finally, when three current sources (e.g., A1, A2 and A3) are all used, 75% of the current is additionally provided.

Therefore, at least one additional current among the 25%, 50% and 75% additional currents may be selected for the purpose of reinforcing amplitude of a low voltage differential signal during the pre-emphasis based on a data rate and a cable load condition of a transmission line in communication using the low voltage differential signal.

In order to selectively use the current sources A1, A2 and A3, the pre-emphasis current select unit 150 is provided. The pre-emphasis current select unit 150 receives an additional current source select signal (SEL) applied from an external source and selects at least one of the current sources A1, A2 and A3, thereby controlling the additional current for pre-emphasis.

The pre-emphasis current select unit 150 includes a current source select unit 151 that receives the additional current source select signal (SEL) and outputs an operational control signal (CL), and select switches (S1, S2, S3) respectively coupled in series to the additional current source (A1, A2, A3) and turned on in response to the operational control signal (CL). The current source select signal (SEL) is a 2-bit signal and can, for example, be input by an external user.

As described above, according to the example embodiments of the present invention, the pre-emphasis apparatus and the pre-emphasis method of the LVDS transmitter generate the pulse signal for pre-emphasis based on the parallel data signals received from the external source and the multiphase clock signals output from the phase locked loop for sampling of the parallel data signals. Further, the generated pre-emphasis pulse signal can be used to apply the pre-emphasis current depending on environmental conditions.

Therefore, the pre-emphasis apparatus and the pre-emphasis method of the LVDS transmitter perform reliable pre-emphasis operations by overcoming the limitations associated with PVT sensitivity in conventional pre-emphasis circuits that utilize conventional delay elements.

While the example embodiments of the present invention and their advantages have been described in detail, it should be understood that various changes, substitutions and alterations may be made herein without departing from the scope of the invention.

What is claimed is:

1. A pre-emphasis apparatus of a low voltage differential signaling (LVDS) transmitter, the pre-emphasis apparatus comprising:
   a pre-emphasis signal generation unit configured to generate a pre-emphasis pulse signal by performing a logical operation on N parallel data signals received from an external source and N-phase clock signals received from a phase locked loop, where N is an integer greater than 1; and
   a pre-emphasis current output unit configured to provide an additional current for a pre-emphasis operation to a LVDS driver in response to the pre-emphasis pulse signal generated by the pre-emphasis pulse signal generation unit, wherein the pre-emphasis pulse signal generation unit comprises:
   N exclusive OR gates configured to perform an XOR operation on an input first parallel data signal and an input second parallel data signal adjacent to the input first parallel data signal to respectively output a first operational signal;
   N AND gates configured to perform an AND operation on the first operational signal and one of the N-phase clock signals corresponding to the input second parallel data signal to respectively output second operational signals; and
   an OR gate configured to perform an OR operation on the second operational signals output from the AND gates to output the pre-emphasis pulse signal.

2. The pre-emphasis apparatus of claim 1, wherein the N-phase clock signals are used for sampling each of the parallel data signals when the N parallel data signals are converted into serial data signals.

3. The pre-emphasis apparatus of claim 1, wherein the generated pre-emphasis pulse signal is generated during a transition section of serial data signal when the N parallel data signals are converted into the serial data signals.

4. The pre-emphasis apparatus of claim 3, wherein the pre-emphasis pulse signal is generated for 1 Unit Interval (UI) during the transition section.

5. The pre-emphasis apparatus of claim 1, wherein N is 7.

6. The pre-emphasis apparatus of claim 1, wherein the pre-emphasis current output unit includes M additional current sources that are connected in parallel to a current source of the LVDS transmitter and configured to provide additional currents in response to the pre-emphasis pulse signal.

7. The pre-emphasis apparatus of claim 6, wherein M is 3.

8. The pre-emphasis apparatus of claim 7, wherein each of the additional current sources provides about 25% of additional current to the current source of the LVDS driver.

9. The pre-emphasis apparatus of claim 1, further comprising a pre-emphasis current select unit configured to control an additional current that is provided through the pre-emphasis current output unit.

10. The pre-emphasis apparatus of claim 9, wherein the pre-emphasis current select unit includes:
    a current source select unit configured to receive an additional current source select signal from an external source and configured to output an operation control signal; and
    select switches respectively connected in series to each of the additional current sources, and each configured to be turned on in response to the operation control signal.

11. A low voltage differential signaling (LVDS) transmitter comprising:
    a phase locked loop configured to generate N-phase clock signals, where N is an integer greater than 1;
    a parallel/serial data converter configured to receive N parallel data signals from an external source and each configured to convert the N parallel data signals into serial data signals in response to the N-phase clock signals;
    a LVDS driver configured to convert the serial data signals output from the parallel/serial data converter so that the serial data signals have a low voltage differential signal level; and
    a pre-emphasis unit configured to generate a pre-emphasis pulse signal by performing a logical operation on the N parallel data signals and the N-phase clock signals and configured to provide an additional current for a pre-emphasis operation to the LVDS driver in response to the pre-emphasis pulse signal, wherein the pre-emphasis unit includes:

a pre-emphasis pulse signal generation unit configured to generate the pre-emphasis pulse signal based on the N parallel data signals and the N-phase clock signals; and a pre-emphasis current output unit configured to provide the additional current to the LVDS driver in response to the pre-emphasis pulse signal generated by the pre-emphasis pulse signal generation unit, wherein the pre-emphasis pulse signal generation unit includes:

N exclusive OR gates configured to perform an XOR operation on an input first parallel data signal and an input second parallel data signal adjacent to the input first parallel data signal to respectively output a first operational signal;

N AND gates configured to perform an AND operation on the first operational signal and one of the N-phase clock signals corresponding to the input second parallel data signal to respectively output second operational signals; and an OR gate configured to perform an OR operation on the second operational signals to output the pre-emphasis pulse signal.

12. The LVDS transmitter of claim 11, wherein the N-phase clock signals are used for sampling each of the parallel data signals when the N parallel data signals are converted into serial data signals.

13. The LVDS transmitter of claim 11, wherein the generated pre-emphasis pulse signal is generated during the transition section of the serial data signal.

14. The LVDS transmitter of claim 13, wherein the pre-emphasis pulse signal is generated for 1 UI during the transition section.

15. The LVDS transmitter of claim 11, wherein the pre-emphasis current output unit includes M additional current sources that is connected in parallel to a current source of the LVDS transmitter and configured to provide additional currents in response to the pre-emphasis pulse signal.

16. The LVDS transmitter of claim 15, wherein each of the additional current sources provides about 25% of additional current to the current source of the LVDS driver.

17. The LVDS transmitter of claim 11, wherein the pre-emphasis unit further includes a pre-emphasis current select unit configured to control an additional current that is provided through the pre-emphasis current output unit.

18. The LVDS transmitter of claim 17, wherein the pre-emphasis current select unit includes:

a current source select unit configured to receive an additional current source select signal from an external source and configured to output an operation control signal; and select switches respectively connected in series to each of the additional current sources and each configured to be turned on in response to the operation control signal.

19. A pre-emphasis method of a low voltage differential signaling (LVDS) transmitter, the method comprising:

generating a pre-emphasis pulse signal by performing a logical operation on N parallel data signals received from an external source and N-phase clock signals received from a phase locked loop, where N is an integer greater than 1; and providing an additional current for a pre-emphasis operation to a LVDS driver in response to the generated pre-emphasis pulse signal, wherein generating the pre-emphasis pulse signal comprises:

outputting N first operational signals by respectively performing an XOR operation on a first parallel data signal of the parallel data signals and second parallel data signal of parallel data signals adjacent to the first parallel data signal;

outputting N second operational signals by respectively performing an AND operation on one of the first operational signals and the N-phase clock signal corresponding to the second parallel data signals; and outputting the pre-emphasis pulse signal by performing an OR operation on the N second operational signals.

20. The pre-emphasis method of claim 19, wherein the generated pre-emphasis pulse signal is generated during the transition section of serial data signal when the N parallel data signals are converted into the serial data signal.

21. The pre-emphasis method of claim 20, wherein the pre-emphasis pulse signal is generated for 1 UI during the transition section.

22. The pre-emphasis method of claim 19, further comprising controlling an additional current to be provided in response to the pre-emphasis pulse signal.

23. The pre-emphasis method of claim 22, wherein adjusting an additional current is controlled such that one of about 25%, 50% and 75% of additional current is provided to the current source of the LVDS driver.

* * * * *

UNITED STATES PATENT AND TRADEMARK OFFICE
CERTIFICATE OF CORRECTION

PATENT NO. : 7,586,330 B2  Page 1 of 1
APPLICATION NO. : 11/503311
DATED : September 8, 2009
INVENTOR(S) : Ju-Hyung Kim It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 86 days.

Signed and Sealed this

Fourteenth Day of September, 2010

David J. Kappos
*Director of the United States Patent and Trademark Office*